(12) United States Patent
Ribeyron et al.

(10) Patent No.: US 7,947,527 B2
(45) Date of Patent: May 24, 2011

(54) METHOD FOR METALLIZATION OF A SEMICONDUCTOR DEVICE

(75) Inventors: Pierre Jean Ribeyron, Saint Ismier (FR); Emmanuel Rolland, Jarrie (FR)

(73) Assignee: Commissariat a l'Energie Atomique, Paris (FR)

( * ) Notice: Subject to any disclaimer, the term of this patent is extended or adjusted under 35 U.S.C. 154(b) by 983 days.

(21) Appl. No.: 11/813,721

(22) PCT Filed: Jan. 18, 2006

(86) PCT No.: PCT/FR2006/050020
§ 371 (c)(1),
(2), (4) Date: Jul. 11, 2007

(87) PCT Pub. No.: WO2006/077342
PCT Pub. Date: Jul. 27, 2006

(65) Prior Publication Data
US 2008/0087319 A1 Apr. 17, 2008

(30) Foreign Application Priority Data
Jan. 20, 2005 (FR) ...................................... 05 50173

(51) Int. Cl.
*H01L 21/00* (2006.01)
*H01L 21/50* (2006.01)
(52) U.S. Cl. ..................... 438/73; 438/82; 257/E21.499
(58) Field of Classification Search ...................... 438/73, 438/80, 82, 87, 93–98
See application file for complete search history.

(56) References Cited

U.S. PATENT DOCUMENTS

| 5,066,340 A | 11/1991 | Iwamoto et al. | |
|---|---|---|---|
| 5,131,954 A * | 7/1992 | Vogeli et al. | 136/244 |
| 5,213,628 A | 5/1993 | Noguchi et al. | |
| 6,091,019 A | 7/2000 | Sakata et al. | |
| 2003/0005954 A1 * | 1/2003 | Emoto et al. | 136/244 |
| 2006/0275936 A1 | 12/2006 | Ribeyron et al. | |

FOREIGN PATENT DOCUMENTS

| EP | 0684652 A2 * | 5/1995 |
|---|---|---|
| EP | 0 684 652 A2 | 11/1995 |
| EP | 0 751 575 A2 | 1/1997 |
| EP | 0 848 431 A2 | 6/1998 |
| EP | 1 102 331 A2 | 5/2001 |
| EP | 2 878 374 | 5/2006 |
| EP | 2006/077343 A1 | 7/2006 |
| WO | WO 2006/085021 A1 | 8/2006 |

* cited by examiner

*Primary Examiner* — Savitri Mulpuri
*Assistant Examiner* — Calvin Choi
(74) *Attorney, Agent, or Firm* — Oblon, Spivak, McClelland, Maier & Neustadt, L.L.P.

(57) ABSTRACT

A method for metallization of a semiconductor device. This method includes a) metallizing a set of collection fingers with a low-temperature serigraphy paste on at least a front surface of the semiconductor device, b) sintering, at a temperature below a temperature that would damage the semiconductor device, the serigraphy paste forming the set of metallized collection fingers, by performing a pressing operation on the collection fingers with a press, and c) metallizing at least one collection bus on the set of metallized collection fingers, electrically connecting the collection fingers to one another, with a low-temperature serigraphy paste.

20 Claims, 4 Drawing Sheets

METHOD FOR METALLIZATION OF A SEMICONDUCTOR DEVICE

TECHNICAL FIELD

This invention relates to a metallization method specifically adapted to so-called "low-temperature" methods for producing semiconductor devices. Such a method is particularly suitable for metallizing a heterojunction solar cell.

PRIOR ART

The principle of the amorphous/crystalline heterojunction is known and has been in the public domain for ten years. Solar cells applying this principle have already been patented.

The principle of this type of cell is to use a crystalline semiconductor substrate with a first type of conductivity. An amorphous semiconductor layer with a second type of conductivity, opposite the first type of conductivity, is deposited on one of the surfaces of the crystalline substrate. A PN junction is thus obtained, and is called a heterojunction because the two semiconductors used have different atomic compositions and do not have the same forbidden bandwidth. It is then simply necessary to produce a transparent electrode on a first surface of the junction and, on a second surface opposite this first surface, to produce an ohmic contact electrode in order to obtain a heterojunction solar cell.

The U.S. Pat. No. 5,066,340 describes a heterojunction solar cell. It comprises a PN junction formed by a crystalline silicon substrate with a first type of conductivity and an amorphous silicon layer with a second type of conductivity, opposite the first type of conductivity, produced on one of the surfaces of the crystalline substrate. This cell also integrates, between the crystalline substrate and the amorphous silicon layer, an intrinsic microcrystalline silicon layer.

The U.S. Pat. No. 5,213,628 also describes a heterojunction solar cell. As in the U.S. Pat. No. 5,066,340, this cell comprises a heterojunction formed by a crystalline silicon substrate with a first type of conductivity and an amorphous silicon layer with a second type of conductivity, opposite the first type of conductivity, produced on one of the surfaces of the crystalline substrate. This cell integrates, between the crystalline substrate and the amorphous silicon layer, an intrinsic microcrystalline silicon layer.

The U.S. Pat. No. 6,091,019 describes a heterojunction cell. On a first surface of a crystalline silicon substrate with a first type of conductivity, a plurality of successive deposits are provided so as to form a stack consisting of a plurality of layers: first, an intrinsic amorphous silicon layer, then an amorphous silicon layer doped with a second type of conductivity opposite the first type of conductivity, then a conductive transparent oxide layer, for example indium and tin oxide (known as ITO for Indium Tin Oxide), and finally the metallization of silver collection fingers. On a second surface opposite the first surface of the crystalline silicon substrate, the deposits are identical except for the second layer, which is amorphous silicon doped with the first type of conductivity. Collection buses are then deposited on the metallizations produced on the two surfaces of the solar cell.

In this type of cell, the metallizations are performed by serigraphy, and must then be annealed. So as not to damage the amorphous silicon layers, the metallizations must be annealed at "low temperature", i.e. at a temperature below around 400° C. This heat treatment is necessary to cause the metal to penetrate the silicon. This condition involves the use of specific so-called "low-temperature" serigraphy pastes, for example based on polymer/silver. The devices that do not comprise amorphous silicon or materials sensitive to a temperature above 400° C. preferably use so-called "high-temperature" serigraphy pastes, which must be annealed at around 800° C. This heat treatment makes it possible for the metal to penetrate the silicon, so as to ensure good contact with the cell, but also to improve the resistivity of the serigraphy paste.

The major disadvantage of so-called "low-temperature" serigraphy pastes is that they have a resistivity ten times higher than the so-called "high-temperature" serigraphy pastes, used in particular in the production of homojunction solar cells. This high resistivity increases the series resistance of the heterojunction cells, causing a reduction in the peaking factor. The peaking factor is the ratio between the product of the maximum output voltage with the maximum output intensity and the product of the open circuit voltage with the short circuit current intensity. This reduction in the peaking factor causes a reduction in the efficiency of the solar cells.

In addition, the adhesion of these so-called "low-temperature" serigraphy pastes to the semiconductor devices is not always satisfactory. This poor adhesion then presents problems in the interconnection of devices by welding on the collection buses.

DESCRIPTION OF THE INVENTION

This invention is intended to propose a method for metallizing a semiconductor device making it possible to reduce the disadvantages mentioned above, i.e. to reduce the resistivity of the serigraphy paste used to metallize the collection fingers of the semiconductor device, and to improve the adhesion of this serigraphy paste on the semiconductor device.

To achieve these objectives, this invention proposes a method for metallization of a semiconductor device including the following steps:

a) metallizing a set of collection fingers with a so-called "low-temperature" serigraphy paste on at least one surface, called the "front surface" of the semiconductor device, b) sintering, at a temperature below a temperature that would damage the semiconductor device, of the serigraphy paste forming the set of metallized collection fingers, by performing a pressing operation on these collection fingers with a press, c) metallizing at least one collection bus on the set of metallized collection fingers, electrically connecting the collection fingers to one another, with a so-called "low-temperature" serigraphy paste.

Thus, in the metallization of a semiconductor device, instead of first performing the metallization of the collection fingers, then the metallization of the collection bus, a sintering operation is inserted between these two steps, which sintering operation is performed at a temperature below a temperature that would damage the semiconductor device, on the serigraphy paste forming metallized collection fingers, by pressing these collection fingers. This sintering makes it possible to reduce the resistivity and to improve the weldability of the paste forming the metallized collection fingers.

This metallization is advantageously applied to semiconductor devices with a heterojunction.

The method can include a step after step c), consisting of sintering, at a temperature below a temperature that would damage the semiconductor device, the serigraphy paste forming the collection bus by a pressing operation on said collection bus performed by the press. This pressing step makes it possible to reduce the resistivity of the serigraphy paste forming the collection bus.

The method can also comprise a step consisting of sintering, at a temperature below a temperature that would damage the semiconductor device, a metallization located on a surface of the semiconductor device opposite the front surface by a pressing operation on said metallization performed by the press. This pressing step makes it possible to reduce the resistivity of the serigraphy paste forming the metallization.

The press used is, for example, a hydraulic or a pneumatic press.

The pressing is preferably performed at a temperature between around room temperature and 400° C. The temperature of 400° C. is approximately the maximum temperature because, at a higher temperature, there would be damage to the amorphous semiconductor.

It is preferable for the pressing to be performed at a pressure level between around $10^6$ Pa and $2 \times 10^8$ Pa, making it possible to sinter the collection fingers.

During the pressing, the semiconductor device can be placed between the press and a support. Means for protecting the semiconductor device can be inserted between the semiconductor device and the press, and between the semiconductor device and the support.

In this case, the protective means are preferably polyethylene terephthalate films.

Means for uniform pressing can also be inserted between the semiconductor device and the press.

In this case, the uniform pressing means are preferably a damper, for example made of rubber or a plastic material, and a plate, for example made of silicon.

The collection fingers are preferably arranged so as to be parallel to one another.

It is possible for the collection fingers to be regularly spaced apart from one another. This arrangement makes it possible to obtain a homogeneous collection of the current.

It is preferable for the collection bus to be arranged so as to be substantially perpendicular to the set of collection fingers.

The metallization of the set of collection fingers and the metallization of the collection bus can be performed by serigraphy.

The collection fingers and the collection bus are preferably produced with an aluminium-based material or a noble metal such as silver.

This invention also relates to a semiconductor device comprising collection fingers and at least one collection bus, of which the collection fingers and the collection bus can be made according to the method described above.

It is preferable for the collection fingers of such a device to have a width of around 100 micrometers and a thickness between around 20 micrometers and 40 micrometers.

It is preferable for the collection bus of such a device to have a minimum width of around 1.5 millimeters and a thickness of around 50 micrometers.

Such a device can advantageously be a solar cell.

A plurality of solar cells can be combined to form a module, wherein said cells are connected in series and/or in parallel.

BRIEF DESCRIPTION OF THE DRAWINGS

This invention can be better understood on reading the description of embodiments examples given purely for indicative purposes and which are in no way limiting, in reference to the appended drawings, in which.

Identical, similar or equivalent parts of the various figures described below have the same numeric references for the sake of consistency between figures.

The various parts shown in the figures are not necessarily shown according to a uniform scale, so as to make it easier to read the figures.

DETAILED DESCRIPTION OF SPECIFIC EMBODIMENTS

Figure 1:
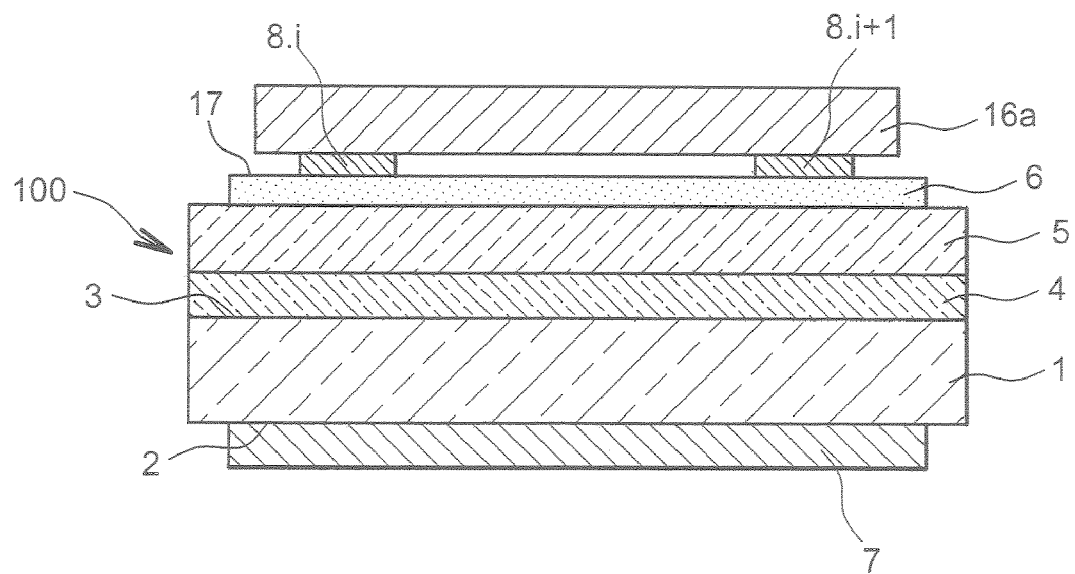
FIG. 1 shows a cross-section of an example of a semiconductor device according to this invention, in which the collection fingers and the collection buses are produced according to a metallization method, also according to this invention.
Figure 3:
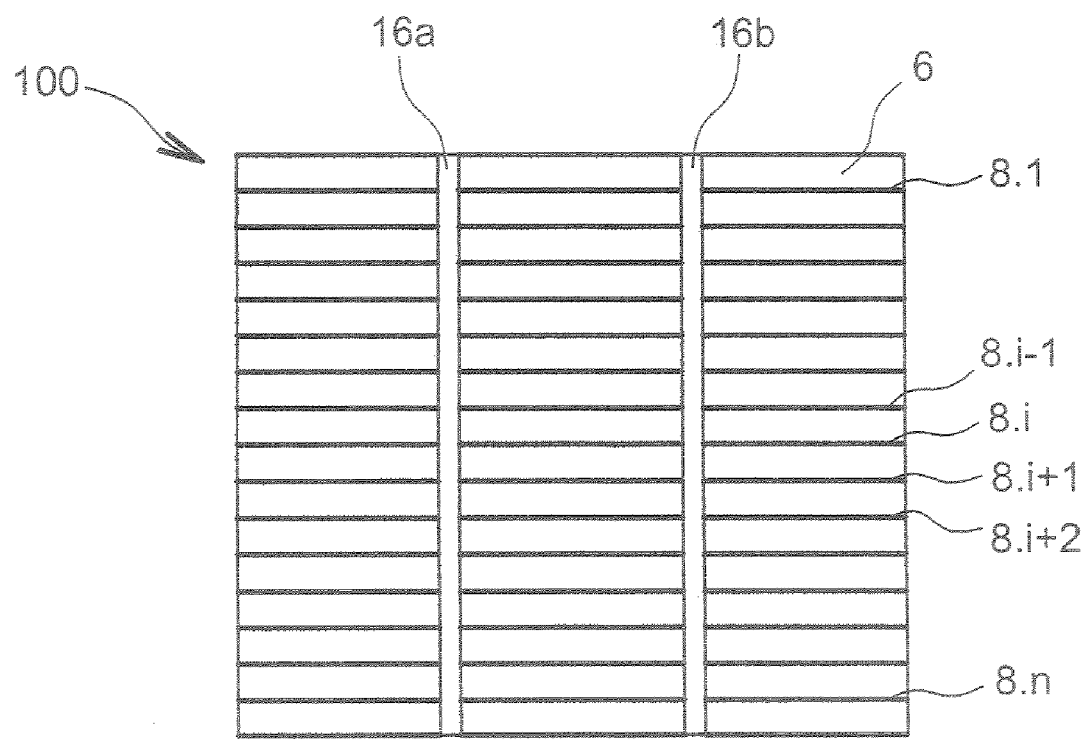
FIG. 3 shows a top view of the set of collection fingers and collection buses, produced according to a metallization method, according to this invention.

Reference is made to FIG. 1, which shows a cross-section of an example of a semiconductor device 100 with a heterojunction, according to this invention, comprising a set of collection fingers 8.1 to 8.n visible in FIG. 3) and at least one collection bus 16a, 16b (collection bus 16b visible in FIG. 3) produced according to a metallization method, also according to this invention. In FIG. 1, only two collection fingers 8.i and 8.i+1 belonging to the set of collection fingers 8.1 to 8.n are shown. In this example, the semiconductor device 100 is a solar cell.

The semiconductor device 100 comprising a crystalline semiconductor substrate 1 with a first type of conductivity is shown. The semiconductor substrate 1 ia for example, N-type thin-layer silicon. It is not necessary to use an extremely high-quality silicon because, given the absence of strong thermal constraints during the semiconductor device 100 production process, the lifetime of the current carriers of the silicon will not be altered. The thickness of the semiconductor substrate 1 can be between 10 micrometers and several hundred micrometers.

The semiconductor substrate 1 comprises a first surface 3 that, in this example, is on the side of a front surface 17 of the solar cell. It is this front surface 17 that is exposed to light. The semiconductor substrate 1 comprises a second surface 2 opposite the first surface 3. This second surface 2 is therefore on the side of the rear surface of the solar cell.

The semiconductor substrate 1 comprises, on its first surface 3, an amorphous semiconductor layer 4. The amorphous semiconductor layer 4 is, for example, intrinsic. In another embodiment, this amorphous semiconductor layer 4 can be gradually doped with a second type of conductivity, opposite the first type of conductivity. It is also possible for this layer 4 to be an intrinsic microcrystalline semiconductor, or for the semiconductor device 100 not to comprise this semiconductor layer 4. The deposition this amorphous semiconductor layer is performed, for example, by a plasma-enhanced chemical vapour deposition technique (PECVD).

An amorphous semiconductor layer 5 with a second type of conductivity, i.e. P, is stacked on top of said amorphous semiconductor layer 4. The semiconductor used to produce amorphous layers 4 and 5 is, for example, thin-layer silicon. The semiconductor device 100 thus produced comprises a heterojunction, formed by the semi-conductor substrate 1 and the amorphous semiconductor layer 5. The deposition of the amorphous semiconductor layer 5 is performed, for example, by PECVD. The thickness of the amorphous semiconductor layers 4 and 5 is around 75 nanometers.

A conductive transparent oxide layer 6, for example, indium and tin oxide, is located on the amorphous semiconductor layer 5. This conductive transparent oxide layer 6 is produced, for example, by cathode sputtering. Its thickness is around 80 nanometers.

The semiconductor device 100 comprises, for example, on the second surface 2 of the semiconductor substrate 1, a metal layer 7. This metal layer 7, for example based on silver, is one of the electrodes of the semiconductor device 100. The semiconductor device 100 can comprise, on the second surface 2 of the semiconductor substrate 1, a structure that is different from the metal layer 7. For example, the semiconductor device 100 can comprise, on its surface 2, the same elements as those located on its surface 3, except for the amorphous semiconductor layer doped with the second type of conductivity, which would then be doped with the first type of conductivity.

We will now describe the method for metallization of the semiconductor device 100, also according to this invention.

A set of collection fingers 8.1 to 8.n is metallized on the conductive transparent oxide layer 6. The collection fingers 8.1 to 8.n are produced, for example, by serigraphy, with the so-called "low-temperature" paste. They have a width of around 100 micrometers and a metallization height of between 20 and 40 micrometers. They each have a metal height substantially identical to within 1 micrometer, and are regularly spaced apart from one another by a distance of around 2 millimeters. This arrangement makes it possible to obtain a homogeneous collection of the current. The number n of collection finger 8.1 to 8.n is therefore dependent on the dimensions of the semiconductor device 100. This number must be sufficient for the series resistance of the semiconductor device 100 not to be too high. The collection finger 8.1 to 8.n are arranged so as to be parallel to one another, and are made of a material based on aluminium or a noble metal, such as silver, for example.

A sintering operation is then performed, at a temperature below a temperature that would damage the semiconductor device 100, on the collection fingers 8.1 to 8.n by pressing said collection finger 8.1 to 8.n. The pressing is performed, or example, at a temperature between around room temperature and 400° C. and at a pressure between around $10^6$ Pa and $2 \times 10^8$ Pa, making it possible to sinter the collection fingers 8.1 to 8.n. The temperature of 400° C. is approximately the maximum temperature because, above it, there would be damage to the semiconductor device 100, and in particular the amorphous semiconductor. This sintering makes it possible to reduce the resistivity from around $5 \times 10^{-5}$ ohm-cm to around $5 \times 10^{-6}$ ohm-cm. This resistivity obtained makes is possible to have a very good peaking factor, greater than 0.75.

Figure 2A:
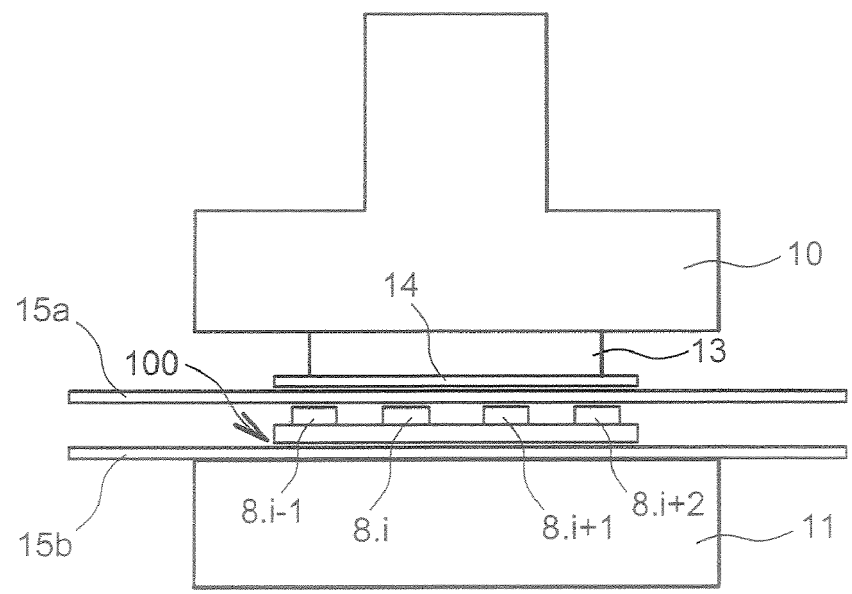
FIG. 2A shows an example of pressing means used during the sintering of the collection fingers.

FIG. 2A shows an example of pressing means used for the sintering of the set of collection fingers 8.1 to 8.n. In this FIG. 2A, four collection fingers 8.i−1, 8.i, 8.i+1, 8.i +2 belonging to the set of collection finger 8.1 to 8.n are shown. A press 10, for example hydraulic or pneumatic, exerts a pressure on the collection fingers 8.i−1, 8.i, 8.i+1, 8.i+2. The semiconductor device 100 is in contact with a support 11. This support 11 resists the pressure exerted by the press 10 without being deformed or moving. The press 10 is not directly in contact with the semiconductor device 100. Means for uniform pressing 13, 14 are, for example, a rubber or plastic damper 13 and a plate 14, for example of silicon, making it possible to uniformly distribute the pressure exerted by the press 10 on the semiconductor device 100. Protective means 15a, 15b for the semiconductor device 100 can also be provided between the press 10 and the semiconductor device 100, and between the support 11 and the semiconductor device 100. These protective means 15a, 15b make it possible not to place the semiconductor device 100 in direct contact with the plate 14 and the support 11, thus preventing impurities from being pressed against the semiconductor device 100. These protective means 15a, 15b can be, for example polyethylene terephthalate films that are changed for each pressing of a semiconductor device 100.

After the sintering of the collection fingers 8.1 to 8.n, at least one collection bus 16a, 16b is metallized on the collection finger 8.1 to 8.n. Again, the number of collection buses is dependent on the dimensions of the semiconductor device 100. The number of collection buses must be adapted according to the width of the semiconductor device 100. In FIG. 3, two collection buses 16a, 16b are metallized on the collection finger 8.1 to 8.n. These collection buses 16a, 16b are produced by serigraphy, with the so-called "low-temperature" serigraphy paste. The collection buses 16a, 16b electrically connect the collection fingers 8.1 to 8.n to one another. These collection buses 16a, 16b have a width greater than that of the collection finger 8.1 to 8.n. It is at least around 1.5 millimeters. Their metallization height is around 50 micrometers. The collection buses 16a, 16bare positioned so as to be substantially perpendicular to the collection finger 8.1 to 8.n. Like the collection fingers 8.1 to 8.n, the collection buses 16a, 16b are made of a material based on aluminium or a noble metal, such as silver, for example.

In a device produced according to the invention, as the current circulating in the collection buses is greater than that circulating in the collection fingers, the collection buses are wider (for example around 2 millimeters) than the collection fingers (for example around 100 micrometers). The collection buses are serigraphically printed with masks of different types, coarser than those used for the serigraphy of the collection fingers, requiring a finer definition. These masks generate thicker metallizations for the collection buses (for example between around 50 and 100 micrometers) than for the collection fingers (for example between around 20 and 40 micrometers). If a sintering operation is performed after the metallization of the collection buses, the areas of the collection fingers located near the collection buses are not subjected to the same pressing as the areas of the collection fingers farther from the collection buses. The method according to the invention makes it possible to improve the adhesion and the resistivity of the metallizations with respect to the prior art.

Figure 2B:
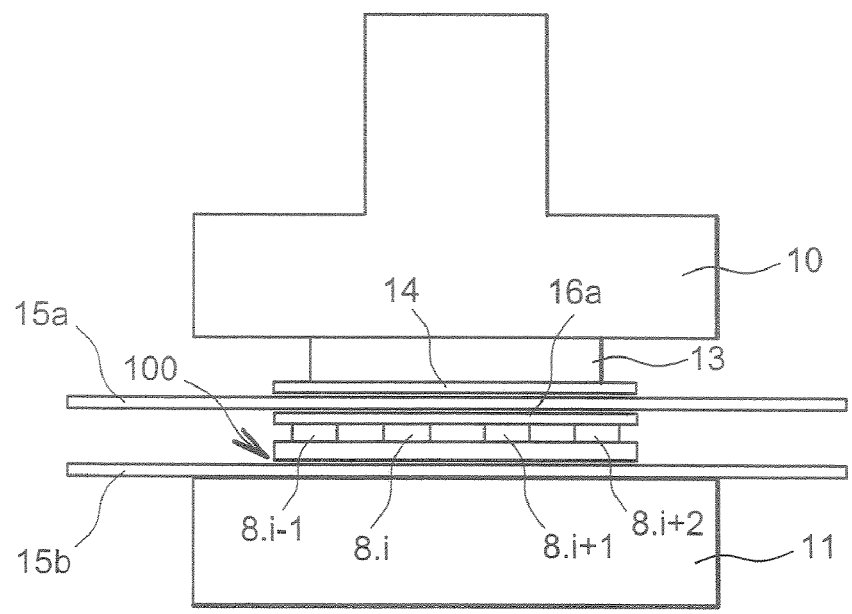
FIG. 2B shows an example of pressing means used during the sintering of the collection buses.

After the metallization of the collection buses 16a, 16b, it is also possible to perform a sintering operation, at a temperature below a temperature that would damage the semiconductor device 100, on the collection buses 16a, 16b by pressing said collection buses 16a, 16b. This pressing is shown in FIG. 2B. The pressing is performed under the same temperature and pressure conditions as the pressing of the collection finger 8.1 to 8.n. In FIG. 2B, a single collection bus 16a is shown. This sintering makes it possible to reduce the resistivity of the serigraphy paste forming the collection buses 16a, 16b. The press 10, the support 11, the damper 13, the plate 14 and the protective means 15a, 15b are identical to those of FIG. 2A.

Figure 2C:
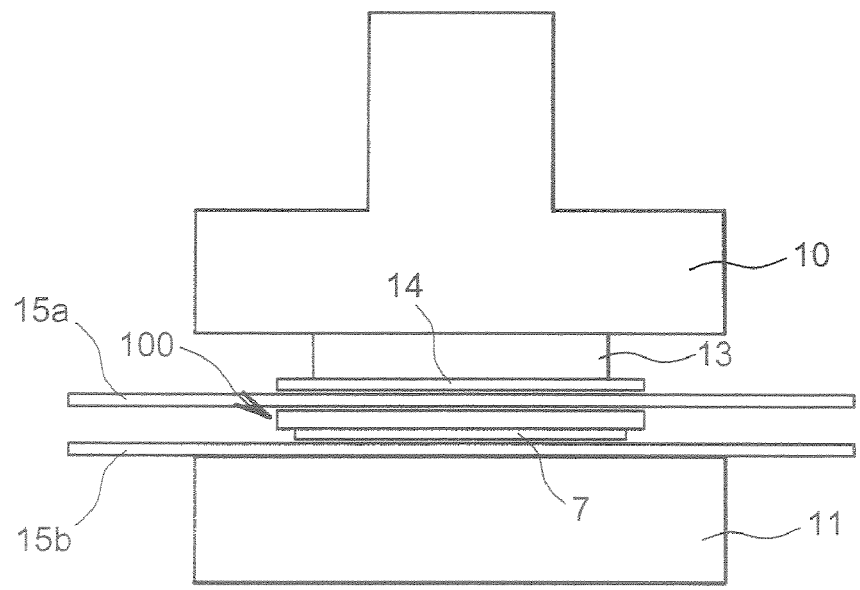
FIG. 2C shows an example of pressing means used during the sintering of the metallization located on the rear surface of the semiconductor device according to this invention.

The method can also comprise a step of sintering, at a temperature below a temperature that would damage the semiconductor device 100, on the metallization 7 located on the surface 2 opposite the front surface 17 of the semiconductor device 100. This additional step is shown in FIG. 2C. Again, the temperature and pressure conditions, the press 10, the support 11, the damper 13, the plate 14 and the protective means 15a, 15b are identical to those of FIG. 2A. This sintering can be performed alone, i.e. after the sintering of the collection fingers 8.1 to 8.n and optionally of the collection bus 16a, 16b. It can also be performed simultaneously with the sintering of the collection finger 8.1 to 8.n or of the collection buses 16a, 16b, with these two sintering operations being combined in a single pressing step of the semiconductor device 100. In this case, the semiconductor device 100 then comprises only the collection finger 8.1 to 8.n not sintered, or the collection finger 8.1 to 8.n already sintered and the collection buses 16a, 16b not sintered, and, on the surface 2, the metallization 7 to be sintered. Thus, in the pressing operation, the pressure exerted makes it possible to sinter the metallizations 7 and 8.1 to 8.n, or 7 and 16a, 16b, located on two opposite surfaces 17, 2 of the semiconductor device 100.

Although a number or embodiments of this invention have been described in detail, it should be understood that various changes and modifications can be made without going beyond the scope of the invention. This metallization is also advantageously applied to semiconductor devices that cannot, for some reason, be subjected to temperatures above around 400° C., such as, for example, devices comprising plastic materials.

Figure 4:
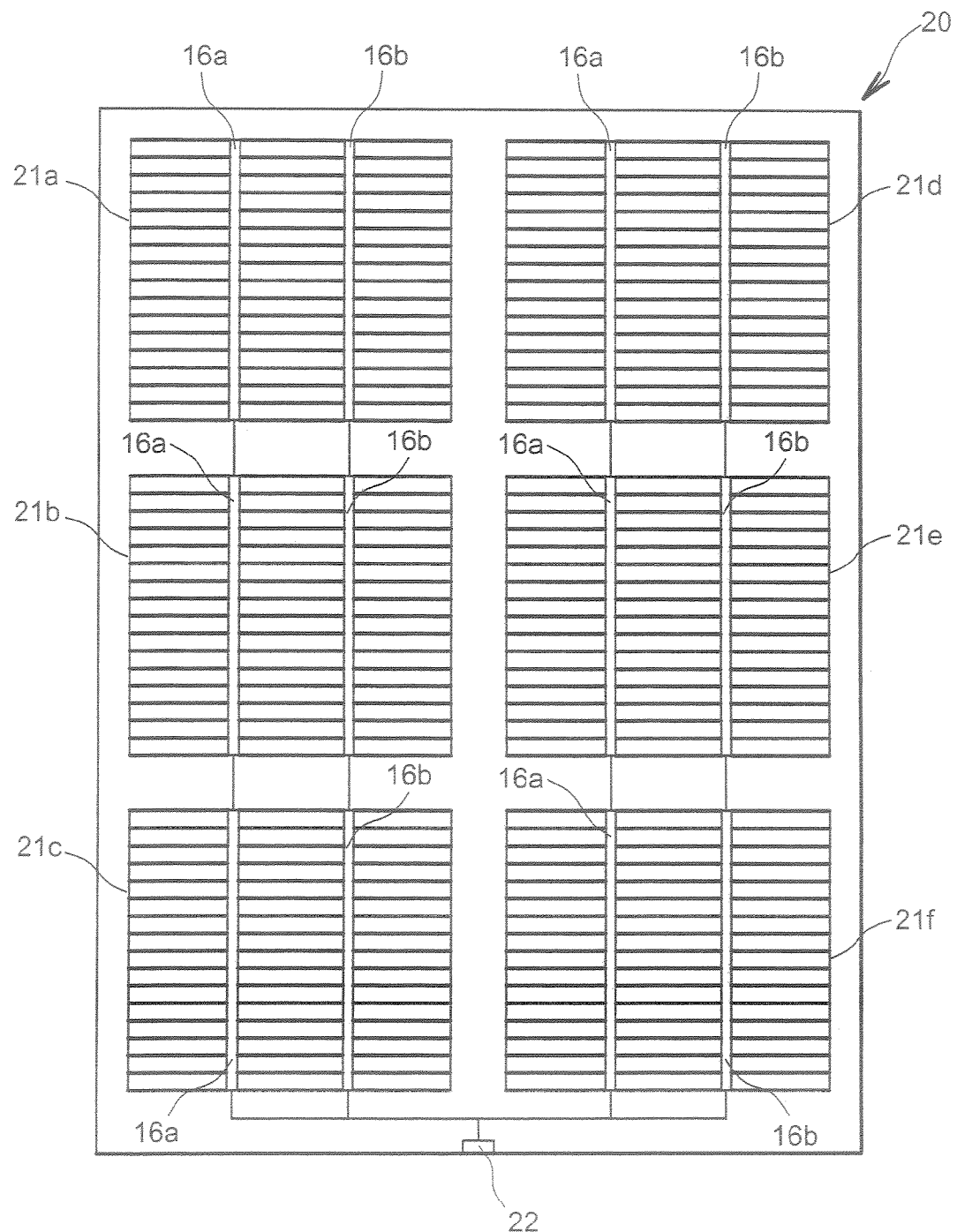
FIG. 4 shows a top view of a module made of a plurality of solar cells connected to one another, also according to this invention.

A number of semiconductor devices according to the invention can be produced at the same time on the substrate 1, and the unitary devices can then be electrically connected to one another by their collection buses so as to obtain a module of solar cells 20, as shown in FIG. 4. In the example of FIG. 4, six solar cells 21a to 21f make up the solar module 20. The collection buses 16a, 16b of the solar cells 21a, 21b, 21c are connected in series as are the collection buses 16a, 16b of the solar cells 21d, 21e, 21f. The collection buses 16a, 16b of the solar cells 21c, 21f are then connected in parallel to obtain an electrode 22 of the solar module 20. The electrodes located on the rear surfaces of the solar cells 21a to 21f are also connected to one another in a manner identical those located on the front surface.

The invention claimed is:

1. A method for metallization of a semiconductor device, comprising, in order:
   a) metallizing, by serigraphy, a set of collection fingers with a low-temperature serigraphy paste on at least a front surface of the semiconductor device;
   b) sintering, at a temperature below a temperature that would damage the semiconductor device, the serigraphy paste forming the set of metallized collection fingers, by performing a pressing operation on the collection fingers with a press; and
   c) metallizing, by serigraphy, at least one collection bus on the set of metallized collection fingers, electrically connecting the collection fingers to one another, with a low-temperature serigraphy paste.

2. A method according to claim 1, the semiconductor device comprising a heterojunction.

3. A method according to claim 1, further comprising, after c), d) sintering, at a temperature below a temperature that would damage the semiconductor device, the serigraphy paste forming the collection bus by a pressing operation on the collection bus performed by the press.

4. A method according to claim 1, further comprising sintering, at a temperature below a temperature that would damage the semiconductor device, a metallization located on a surface of the semiconductor device opposite the front surface by a pressing operation on the metallization performed by the press.

5. A method according to claim 1, the press being a hydraulic or a pneumatic press.

6. A method according to claim 1, the pressing operation being performed at a temperature between around room temperature and 400° C.

7. A method according to claim 1, the pressing operation being performed at a pressure level between around $10^6$ Pa and $2 \times 10^8$ Pa.

8. A method according to claim 1, the semiconductor device being placed between the press and a support, during the pressing, and means for protecting the semiconductor device being inserted between the semiconductor device and the press, and between the semiconductor device and the support.

9. A method according to claim 8, the protective means comprising polyethylene terephthalate films.

10. A method according to claim 1, wherein means for uniform pressing are inserted between the semiconductor device and the press.

11. A method according to claim 10, the uniform pressing means including one of a damper, a damper made of rubber or a plastic material, a plate, or a plate made of silicon.

12. A method according to claim 1, the collection fingers being arranged so as to be parallel to one another.

13. A method according to claim 1, the collection fingers being regularly spaced apart from one another.

14. A method according to claim 1, the collection bus being arranged so as to be substantially perpendicular to the set of collection fingers.

15. A method according to claim 1, the collection fingers and the collection bus being produced with an aluminium-based material, or a noble, or silver.

16. A semiconductor device comprising collection fingers and at least one collection bus, the collection fingers and the collection bus being made according to the method of claim 1.

17. A semiconductor device according to claim 16, the collection fingers having a width of around 100 micrometers and a thickness between around 20 micrometers and 40 micrometers.

18. A semiconductor device according to claim 16, the collection bus having a minimum width of around 1.5 millimeters and a thickness of around 50 micrometers.

19. A semiconductor device according to claim 16, the semiconductor device being a solar cell.

20. A module of solar cells, comprising a plurality of solar cells according to claim 19, connected in series and/or in parallel.

* * * * *